(12) United States Patent
Ito et al.

(10) Patent No.: US 6,774,748 B1
(45) Date of Patent: Aug. 10, 2004

(54) RF PACKAGE WITH MULTI-LAYER SUBSTRATE HAVING COPLANAR FEED THROUGH AND CONNECTION INTERFACE

(75) Inventors: Masaharu Ito, Tokyo (JP); Kenichi Maruhashi, Tokyo (JP); Kazuhiro Ikuina, Tokyo (JP); Keiichi Ohata, Tokyo (JP)

(73) Assignee: NEC Corporation, Tokyo (JP)

( * ) Notice: Subject to any disclaimer, the term of this patent is extended or adjusted under 35 U.S.C. 154(b) by 67 days.

(21) Appl. No.: 09/711,541

(22) Filed: Nov. 13, 2000

(30) Foreign Application Priority Data

Nov. 15, 1999 (JP) ............................................ 11-324739

(51) Int. Cl.⁷ .......................................... H01L 23/051
(52) U.S. Cl. ....................... 333/247; 257/664; 257/728
(58) Field of Search ................................ 333/247, 238; 257/728, 664, 28

(56) References Cited

U.S. PATENT DOCUMENTS

| | | | | |
|---|---|---|---|---|
| 4,908,694 A | * | 3/1990 | Hidaka et al. | ............... 257/664 |
| 5,852,391 A | * | 12/1998 | Watanabe et al. | ........... 333/246 |
| 5,929,728 A | * | 7/1999 | Barnett et al. | ............... 333/239 |
| 6,057,600 A | * | 5/2000 | Kitazawa et al. | ........... 257/728 |
| 6,215,377 B1 | * | 4/2001 | Douriet | ....................... 333/247 |
| 6,617,946 B2 | * | 9/2003 | Kennedy et al. | ......... 333/247 X |

FOREIGN PATENT DOCUMENTS

| | | |
|---|---|---|
| JP | 63-107055 | 5/1988 |
| JP | 63-261859 | 10/1988 |
| JP | 2-291152 | 11/1990 |
| JP | 4-312960 | 11/1992 |
| JP | 5-75313 | 3/1993 |
| JP | 5-175356 | 7/1993 |
| JP | 5-86859 | 12/1993 |
| JP | 6-112352 | 4/1994 |
| JP | 6-224604 | 8/1994 |
| JP | 8-172303 | 7/1996 |
| JP | 9-23106 | 1/1997 |
| JP | 9-321501 | 12/1997 |
| JP | 10-242716 | 9/1998 |
| JP | 10-303333 | 11/1998 |
| JP | 11-68416 | 3/1999 |
| JP | 11-312751 | 11/1999 |

OTHER PUBLICATIONS

"Multichip MMIC Package for X and Ka Bands", IEEE Transactions on Components, Packaging and Manufacturing Technology—Part B, vol. 20, Feb. 1997.

* cited by examiner

*Primary Examiner*—Benny Lee
(74) *Attorney, Agent, or Firm*—Choate, Hall & Stewart

(57) ABSTRACT

An RF package includes a multilayered dielectric substrate, a feed-through, and metal members. First and second dielectric substrates are formed on the multilayered dielectric substrate. The multilayered dielectric substrate has a cavity where a semiconductor element is to be mounted. The feed-through connects the inside and outside of the cavity and is comprised of a coplanar line formed on the first dielectric substrate and an inner layer line obtained by forming the second dielectric substrate on the coplanar line. The coplanar line and the inner layer line share a strip-like signal conductor. The metal members are formed at a connection interface between the coplanar line and the inner layer line on two sides of the signal conductor.

7 Claims, 10 Drawing Sheets

US 6,774,748 B1

RF PACKAGE WITH MULTI-LAYER SUBSTRATE HAVING COPLANAR FEED THROUGH AND CONNECTION INTERFACE

BACKGROUND OF THE INVENTION

The present invention relates to an RF package and, more particularly, to an RF package with a feed-through.

A package using a coplanar line is suitable for mounting an MMIC (Microwave Monolithic Integrated Circuit) by flip-chip mounting. D. R. Decker et al., "Multichip MMIC Package for X and Ka Bands", IEEE Transactions on Components, Packaging and Manufacturing Technology—Part B. Vol. 20, February 1997, pp. 27–33 proposes a ceramic package which is comprised of a promisingly low-cost multilayered substrate.

FIGS. 8 to 11 show the structure of a conventional ceramic package. Referring to FIG. 8, a ceramic package 1 is comprised of a cavity 3 where a semiconductor element 2 is to be mounted, and a feed-through 4 for connecting the inside and outside of the cavity 3. As shown in FIGS. 9 and 10, the feed-through 4 is divided into a coplanar line 4a and inner layer line 4b, and is comprised of a signal conductor 5, a ground conductor 6a on the lower surface of a first layer substrate 1a, a ground conductor 6b of the coplanar line 4a, and a ground conductor 6c on the upper surface of a second layer substrate 1b (see FIG. 9).

The cavity 3 is hermetically sealed by an upper lid 7 so that it is hermetically held (see FIG. 8). In order to equalize electric potential, a plurality of via holes 8a for connecting the ground conductors 6a and ground conductor 6b to each other, and a plurality of via holes 8b for connecting the ground conductors 6a, 6b, and 6c to each other are formed along the signal propagating direction (see FIG. 9).

As shown in FIGS. 10 and 11, in the structure of the conventional ceramic package, when a distance λ from a connection interface c–c' (see FIG. 10) between the coplanar line 4a and inner layer line 4b to the center of the endmost via hole 8b formed to extend through the first and second layer substrates 1a and 1b (see FIG. 11) increases with respect to a signal wavelength, a signal is radiated in an outward propagation mode between the connection interface c–c' and the endmost via hole 8b into a plane-parallel plate, constituted by the ground conductor 6b of the coplanar line 4a and the ground conductor 6c on the upper surface of the second layer substrate 1b. Studies made by the present inventors clarified that in the conventional ceramic package, the transmission characteristics in the feed-through 4 degraded due to this signal radiation.

For example, in the prior art, when a signal up to 60 GHz is to be transmitted to a feed-through made of a dielectric substrate with a specific dielectric constant of 7.1, the distance λ must be 0.3 mm or less. To form a via hole at such a short distance degrades the yield because cracking occurs in the manufacture. For this reason, it is difficult to set the distance λ very small (to about up to 0.4 mm), and problems arise in the yield of the manufacture, degradation in transmission characteristics of an RF signal, and the like.

SUMMARY OF THE INVENTION

It is an object of the present invention to provide an RF package with a feed-through structure in which transmission characteristics of an RF signal do not degrade.

It is another object of the present invention to provide an RF package with a feed-through structure in which the yield in the manufacture is improved.

In order to achieve the above objects, according to the present invention, there is provided an RF package comprising a multilayered dielectric substrate on which first and second dielectric substrates are formed, the multilayered dielectric substrate having a cavity where a semiconductor element is to be mounted, a feed-through for connecting an inside and outside of the cavity and comprised of a coplanar line formed on the first dielectric substrate and an inner layer line obtained by forming the second dielectric substrate on the coplanar line, the coplanar line and the inner layer line sharing a strip-like signal conductor, and metal members formed at a connection interface between the coplanar line and the inner layer line on two sides of the signal conductor.

BRIEF DESCRIPTION OF THE DRAWINGS

FIG. 12 is a graph showing the relationship between the presence/absence of interface electrodes and the radiation loss of the feed-through.

DESCRIPTION OF THE PREFERRED EMBODIMENTS

The present invention will be described in detail with reference to the accompanying drawings.

Figure 1:
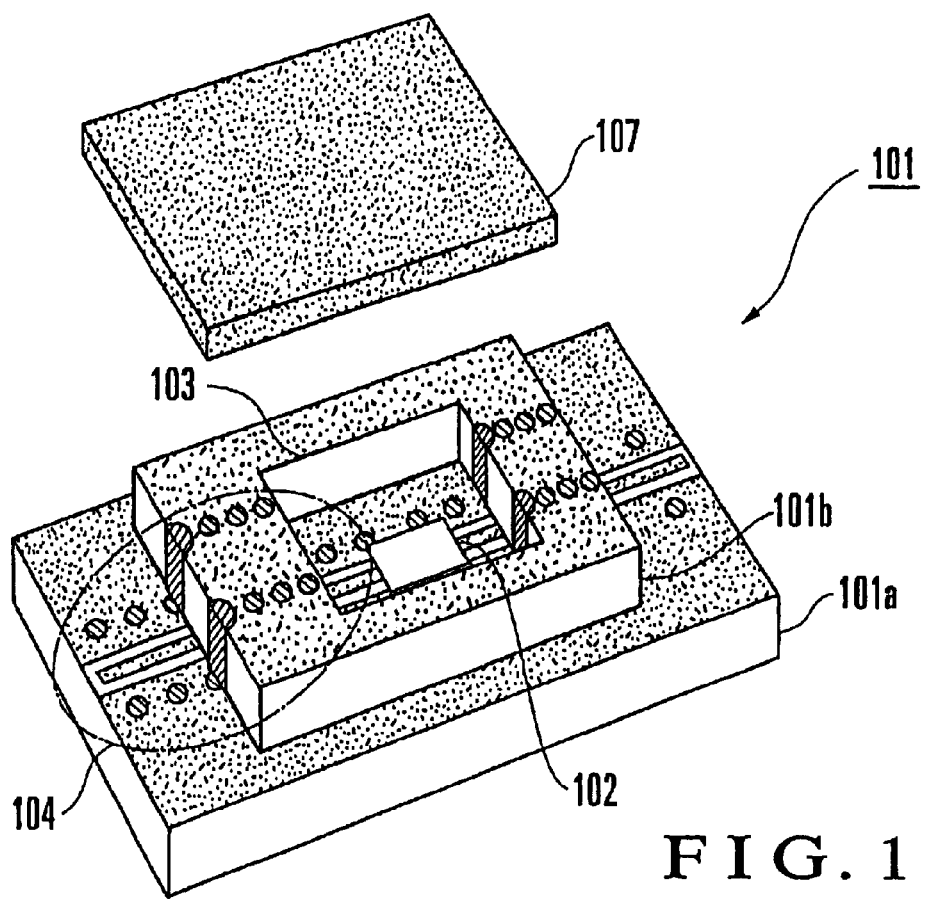
FIG. 1 is a perspective view of an RF package according to the first embodiment of the present invention.

FIG. 1 shows a ceramic package according to the first embodiment of the present invention. Referring to FIG. 1, a ceramic package 101 is comprised of a rectangular first layer dielectric substrate (to be referred to as a first layer substrate hereinafter) 101a, a rectangular second layer dielectric substrate (to be referred to as a second layer substrate hereinafter) 101b formed on and smaller than the first layer substrate 101a, a cavity 103 formed by punching the central portion of the second layer substrate 101b and where a semiconductor element 102 is to be mounted, and a feed-through 104 formed on the surfaces of the first and second layer substrates 101a and 101b and serving as a planar waveguide that connects the inside and outside of the cavity 103.

Figure 2:
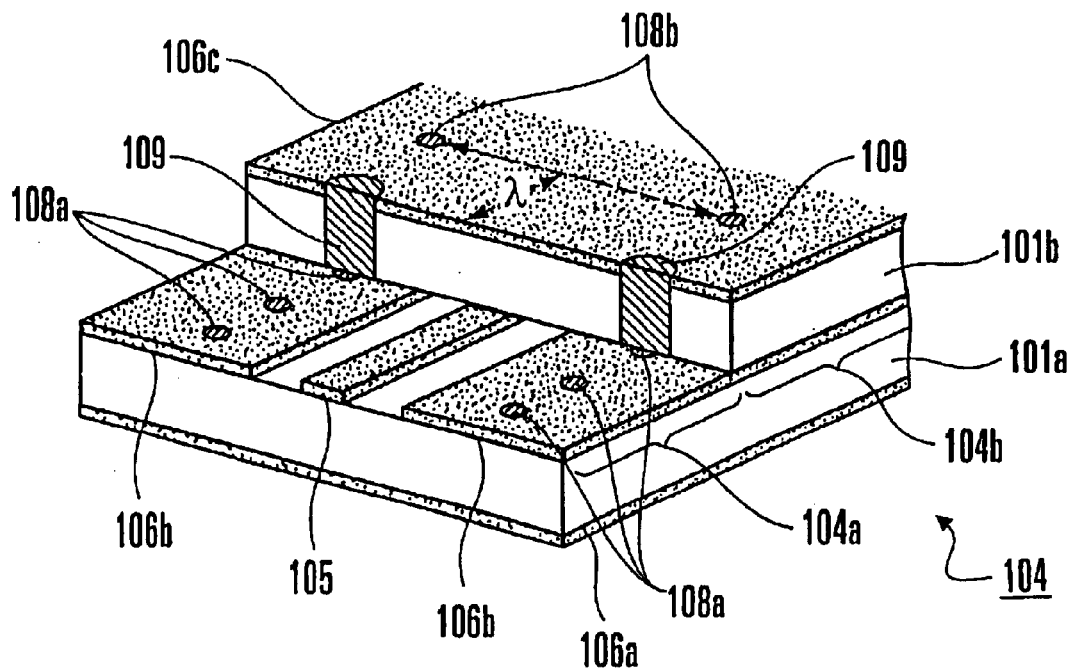
FIG. 2 is a perspective view of a feed-through shown in FIG. 1.
Figure 3:
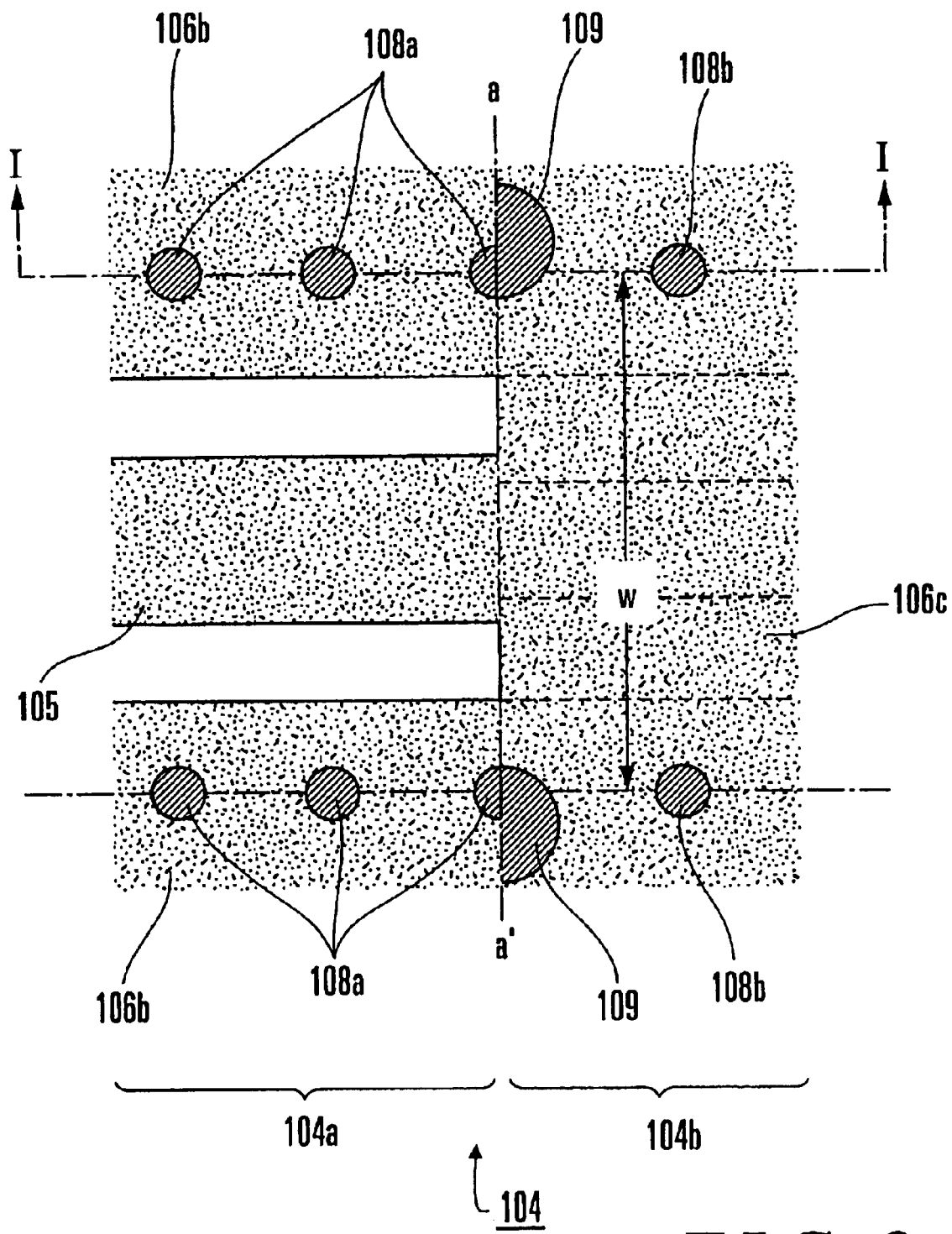
FIG. 3 is a plan view of the feed-through shown in FIG. 2.

As shown in FIGS. 1, 2 and 3, the feed-through 104 (see FIG. 1) is comprised of a coplanar line 104a formed on the first layer substrate 101a, and an inner layer line 104b obtained by forming the second layer substrate 101b on the coplanar line 104a. More specifically, the inner layer line 104b is comprised of the coplanar line 104a formed between the first and second layer substrates 101a and 101b (see FIG. 2). The feed-through 104 has a conductor structure consisting of a signal conductor (strip conductor) 105 formed on the upper surface of the first layer substrate 101a, a ground conductor 106a formed on the lower surface of the first layer substrate 101a, a pair of ground conductors (planar ground conductors) 106b formed on two sides of the signal conductor 105 at a predetermined gap, and a ground conductor 106c formed on the upper surface of the second layer substrate 101b, as shown in FIG. 2. The cavity 103 is hermetically sealed by an upper lid 107 so that it is hermetically held, as shown in FIG. 1.

Figure 4:
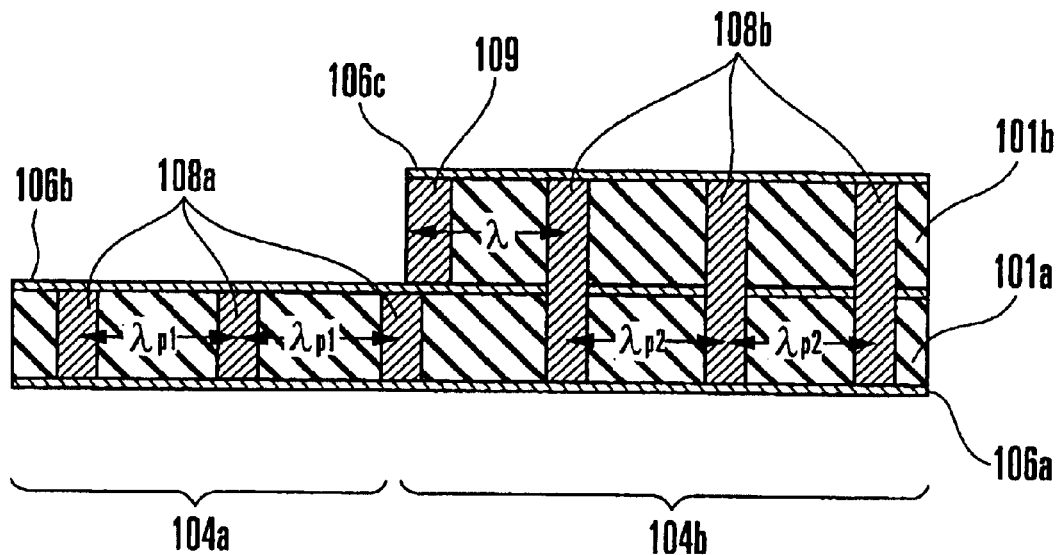
FIG. 4 is a sectional view taken along the line I—I of FIG. 3.

As shown in FIG. 4, in order to equalize electric potential, via holes 108a for connecting the ground conductors 106a and 106b to each other are formed to extend through the first layer substrate 101a, and via holes 108b for connecting the ground conductors 106a, 106b, and 106c to each other are formed to extend through the first and second layer substrates 101a and 101b. The via holes 108a and 108b are formed in two rows along the signal conductor. In this case, pitches $\lambda_{p1}$ and $\lambda_{p2}$ of the respective via holes 108a and 108b in the signal propagating direction desirably satisfy the following expressions (1) and (2):

$$\lambda_{p1} < \frac{c}{2f\sqrt{\frac{\varepsilon_r+1}{2}}} \quad (1)$$

$$\lambda_{p2} < \frac{c}{2f\sqrt{\varepsilon_r}} \quad (2)$$

where c, f, and $\varepsilon_r$ respectively indicate the speed of light, the signal frequency, and the specific dielectric constant of the dielectric substrate.

On a connection interface a–a' between the coplanar line 104a and inner layer line 104b, as shown in FIG. 3, semicircular cylindrical interface electrodes (metal electrodes with cutout end faces) 109 for connecting the ground conductors 106b and 106c to each other are formed on the rows of the via holes 108a and 108b. In this case, the edges of the interface electrodes 109 on the signal conductor 105 side desirably match the edges of the via holes 108a and 108b, as shown in FIG. 3.

If the ground conductors 106b and 106c are not connected to each other with the interface electrodes 109, an effect is still provided by the interface electrodes 109. If the ground conductors 106b and 106c are connected to each other, a higher effect can be obtained. When a plurality of interface electrodes 109 are arranged on the two sides of the signal conductor 105 each in one row along the connection interface a–a', it is more effective in suppressing an electromagnetic field that extends from the outside of the interface electrodes 109.

Figure 12:
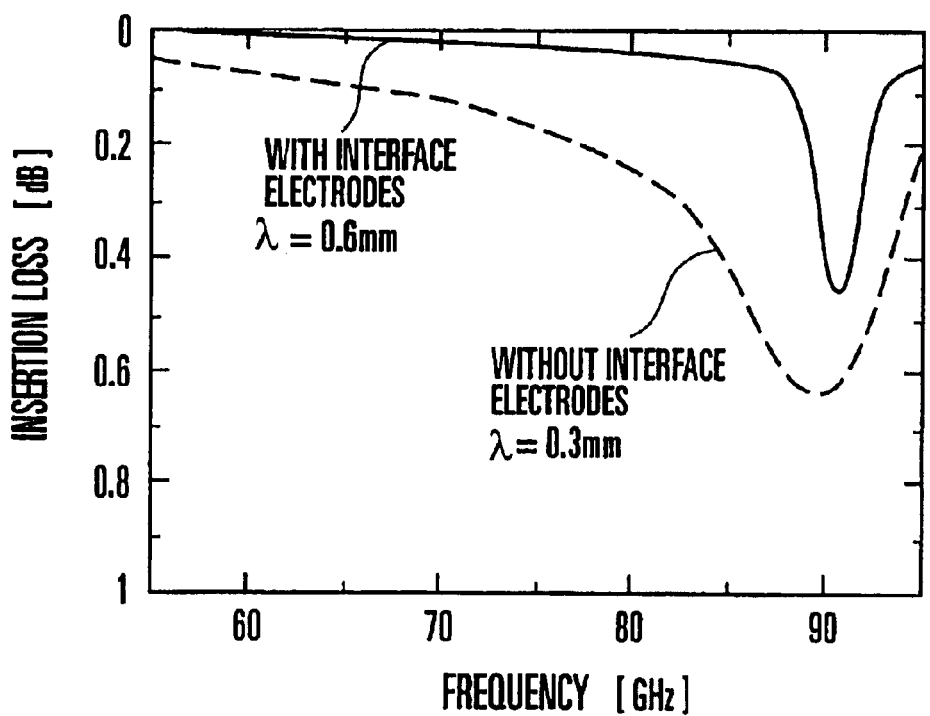

FIG. 12 shows the radiation loss of the feed-through 104 without interface electrodes 109 ($\lambda$) =0.3 mm) and with interface electrodes 109 ($\lambda$=0.6 mm). The radiation loss of FIG. 12 is obtained when the radius of the interface electrodes is 0.2 mm, the radius of the via holes is 0.1 mm, and the specific dielectric constant is 7.1. Note that the distance $\lambda$ (FIGS. 2 and 4) is the distance from the connection interface a–a' to the center of the endmost via hole 108b.

As shown in FIG. 12, when compared to the case without the interface electrodes 109, with the interface electrodes 109, the radiation loss is greatly decreased. The radiation loss has an extreme value at a specific frequency. The specific frequency is a frequency at which the distance $\lambda$ corresponds to about half wavelength and quarter wavelength in the case with the interface electrodes 109 and in the case without the interface electrodes 109, respectively.

When the interface electrodes 109 are provided, if the distance $\lambda$ is set to satisfy expression (3), the frequency at which the radiation loss takes the extreme value can be set outside the signal frequency band, so that the radiation loss of the feed-through 104 can be decreased.

$$\lambda < \frac{c}{2f\sqrt{\varepsilon_r}} \quad (3)$$

In this manner, when the interface electrodes 109 are provided, the distance $\lambda$ can be set twice that obtained when no interface electrodes 109 are provided. As a result, the via holes 108b can be formed with a manufacturing margin without degrading the performance.

If the frequency is high, a higher-order mode exists which propagates through a waveguide structure constituted by the via holes 108b and ground conductors 106a, 106b, and 106c. Therefore, the signal mode is transformed into the higher-order mode due to the discontinuity at the connection interface a–a' between the coplanar line 104a and inner layer line 104b, thereby degrading the transmission characteristics. In order to cut off this higher-order mode, the pitch w (see FIG. 3) of the via holes 108a and 108b in a direction perpendicular to the signal propagating direction desirably satisfies the following expression (4):

$$w < \frac{c}{2f\sqrt{\varepsilon_r}} \quad (4)$$

Although the interface electrodes 109 have a semicircular cylindrical shape in this embodiment, their shape is not limited to this. When the interface electrodes 109 are circular cylindrical, cracking is not easily caused by a stress.

To manufacture the feed-through with the structure described above, first, the via holes 108a and 108b are formed in the first and second layer substrates 101a and 10b, holes for the interface electrodes 109 are formed simultaneously, and these holes are filled with a metal paste. The second layer substrate 101b is bored to form the cavity 103.

Figure 13:
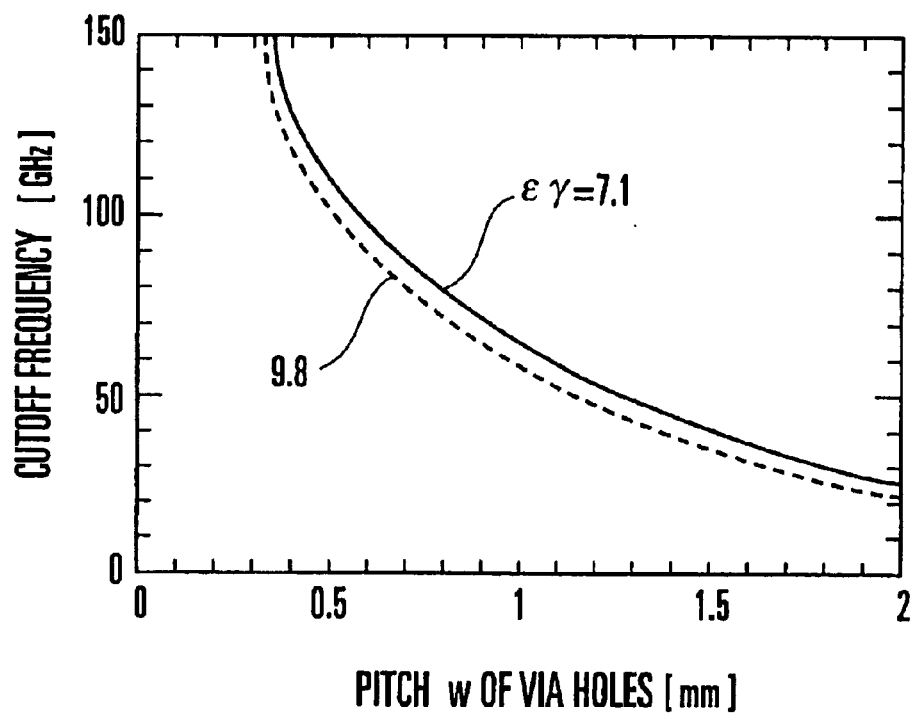
FIG. 13 is a graph showing the relationship between the pitch w of the via holes and a higher-order mode cutoff frequency.

Even when the edges of the interface electrodes 109 match the edges of the via holes 108a and 108b, the pitch w of the via holes 108a and 108b can be set to about 0.5 mm. FIG. 13 shows the relationship between the higher-order mode cutoff frequency and the pitch w. As shown in FIG. 13, when a dielectric substrate with a specific dielectric constant of 7.1 is used, the signal up to 110 GHz can be transmitted without degrading the insertion loss.

The cross-sections of the interface electrodes 109 which are, e.g., semicircular cylindrical, may be larger than those of the via holes 108a and 108b. If the cross-sections of the interface electrodes 109 increase, when the interface electrodes 109 are to be formed on the end face of the second layer substrate 101b, the yield can be improved and stable ground-to-ground connection can be performed. Since expression (3) is a sufficient condition, when the cross-sections of the interface electrodes 109 increase, the ratio of conductors to the segment with the distance $\lambda$ increases, and the distance $\lambda$ can be set large. Furthermore, when the interface electrodes 109 are formed using co-fired ceramics, reliable ground-to-ground connection can be achieved by the interface electrodes 109.

Figure 6:
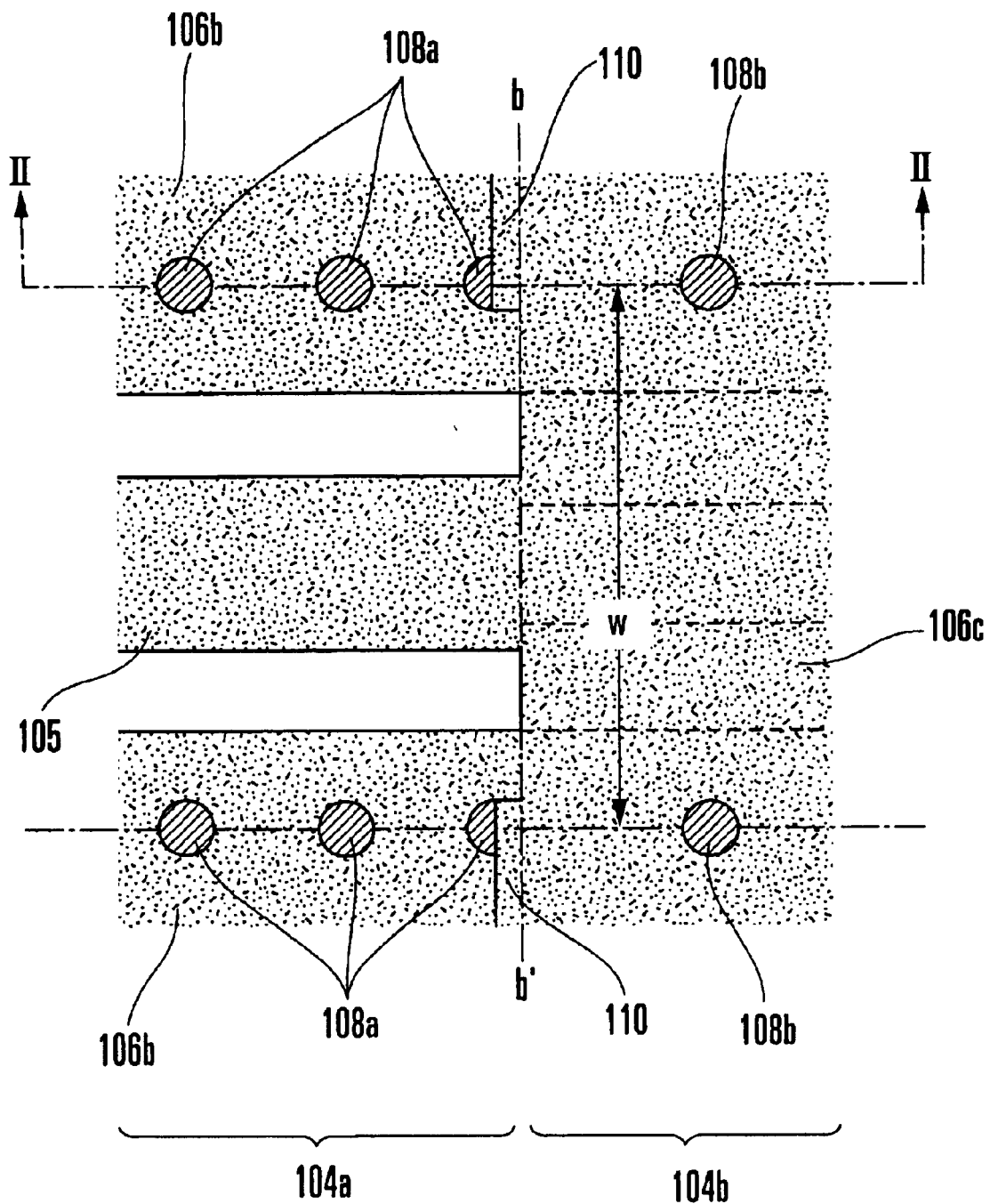
FIG. 6 is a plan view of the feed-through shown in FIG. 5.
Figure 7:
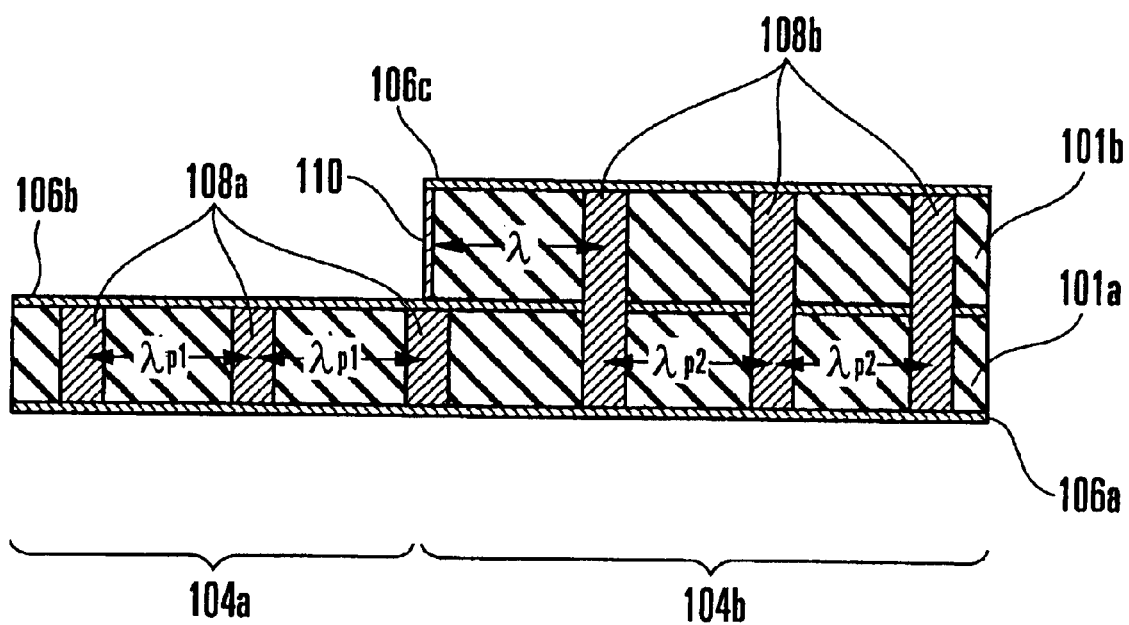
FIG. 7 is a sectional view taken along the line II—II of FIG. 6.
Figure 8:
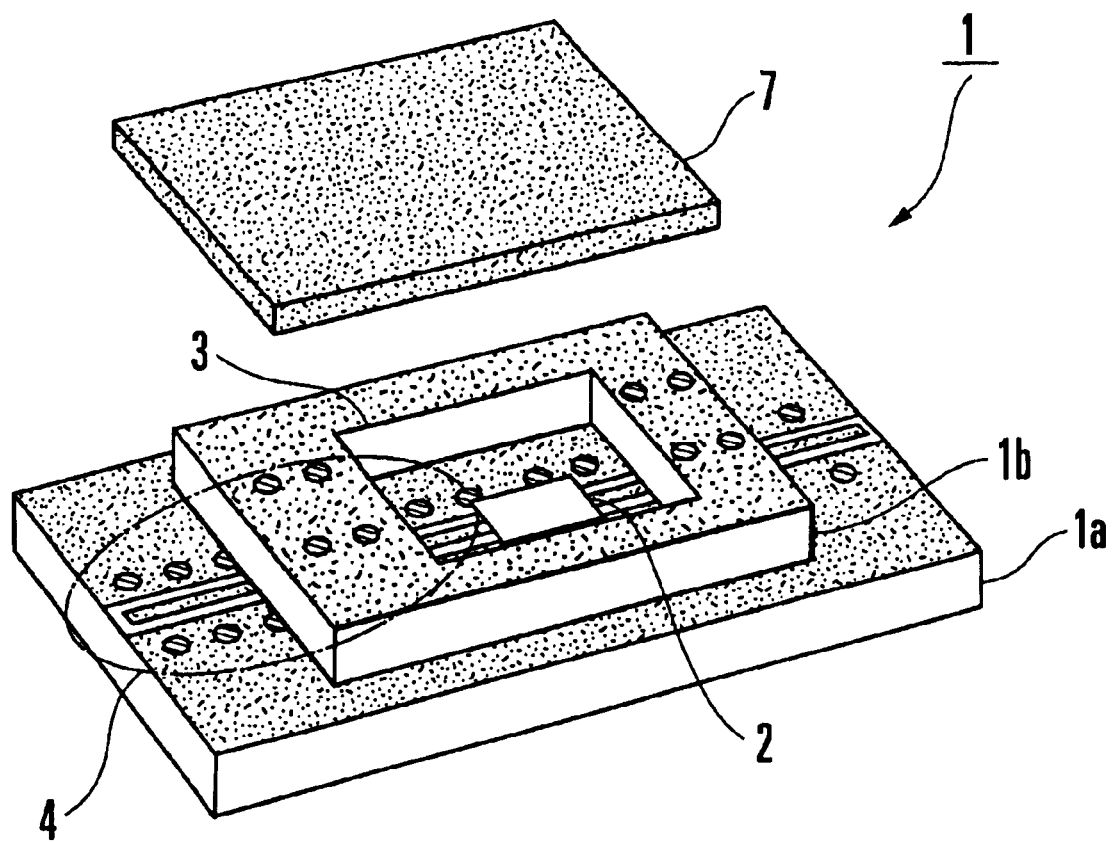
FIG. 8 is a perspective view of a conventional ceramic package.
Figure 9:
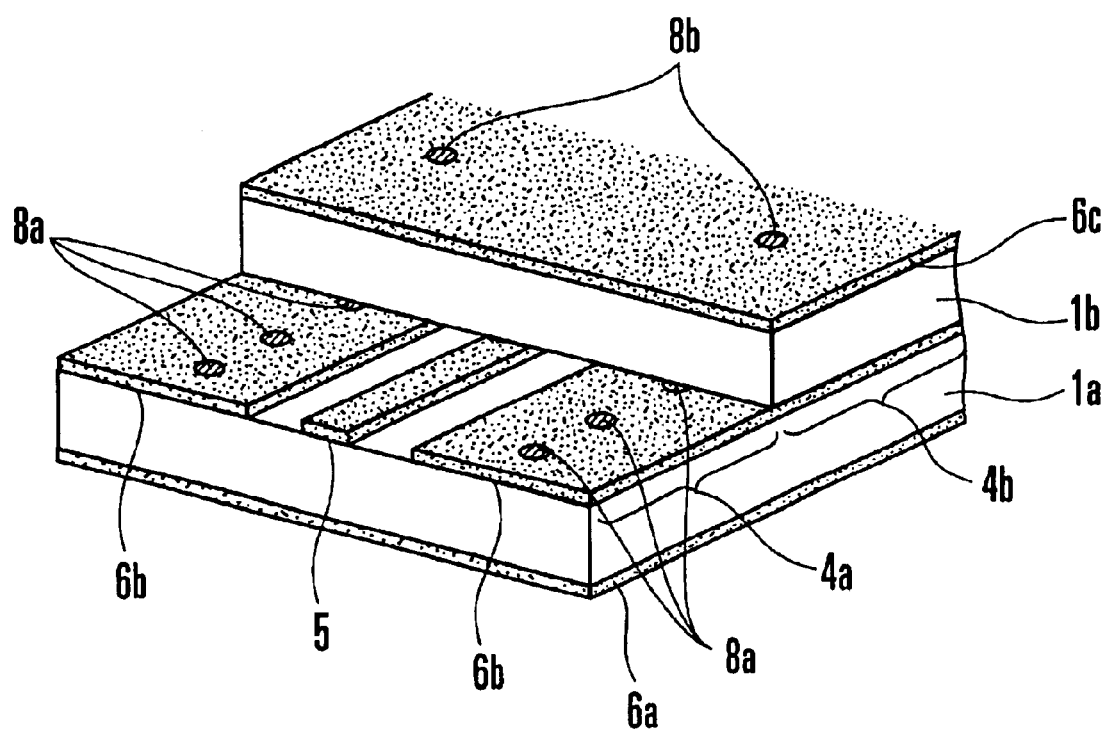
FIG. 9 is a perspective view of a feed-through shown in FIG. 8.
Figure 10:
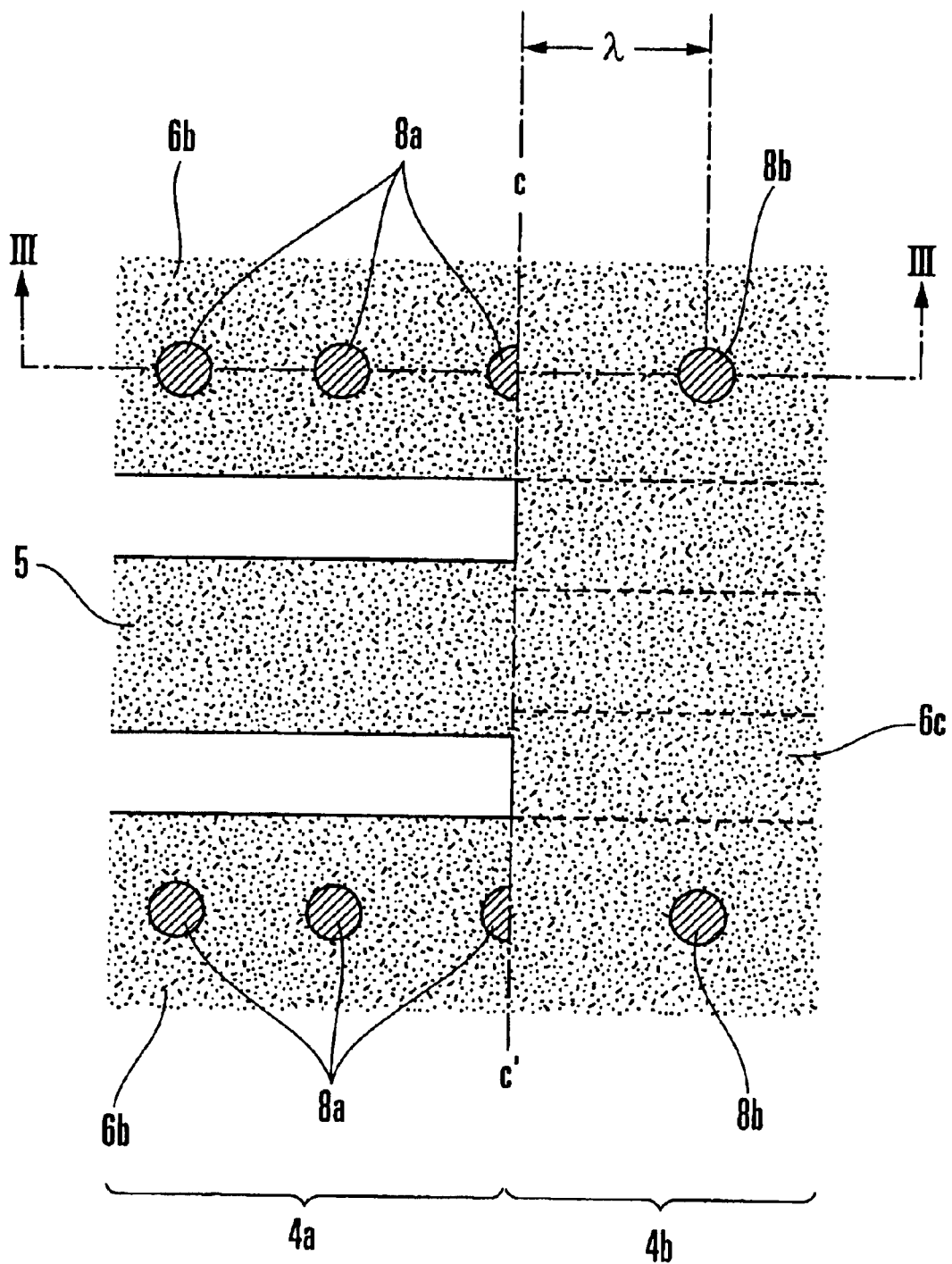
FIG. 10 is plan view of the feed-through shown in FIG. 9.
Figure 11:
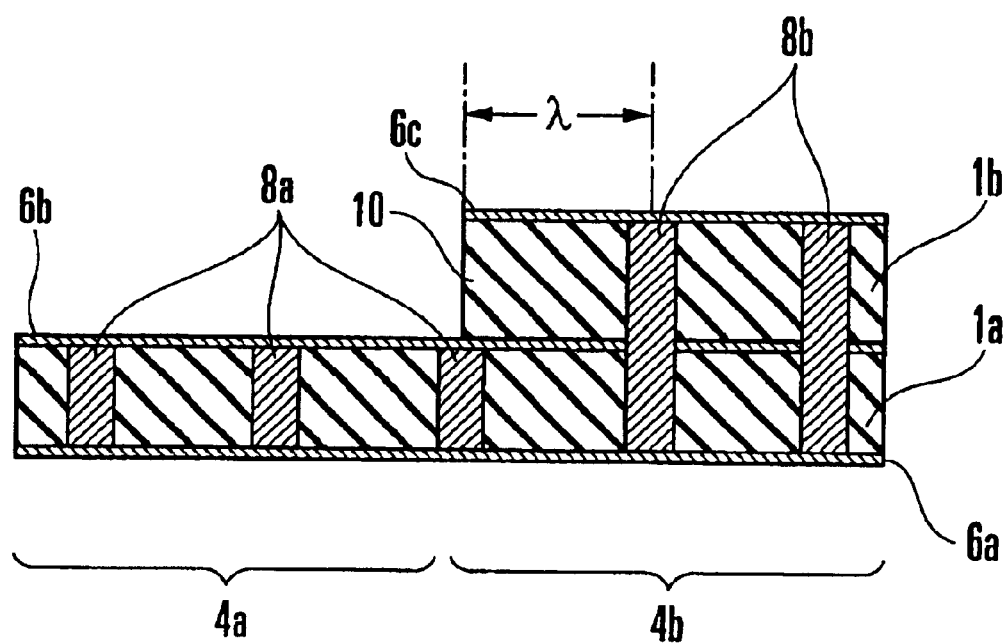
FIG. 11 is a sectional view taken along the line III—III of FIG. 10.

An RF package according to the second embodiment of the present invention will be described with reference to FIGS. 5 to 7.

Figure 5:
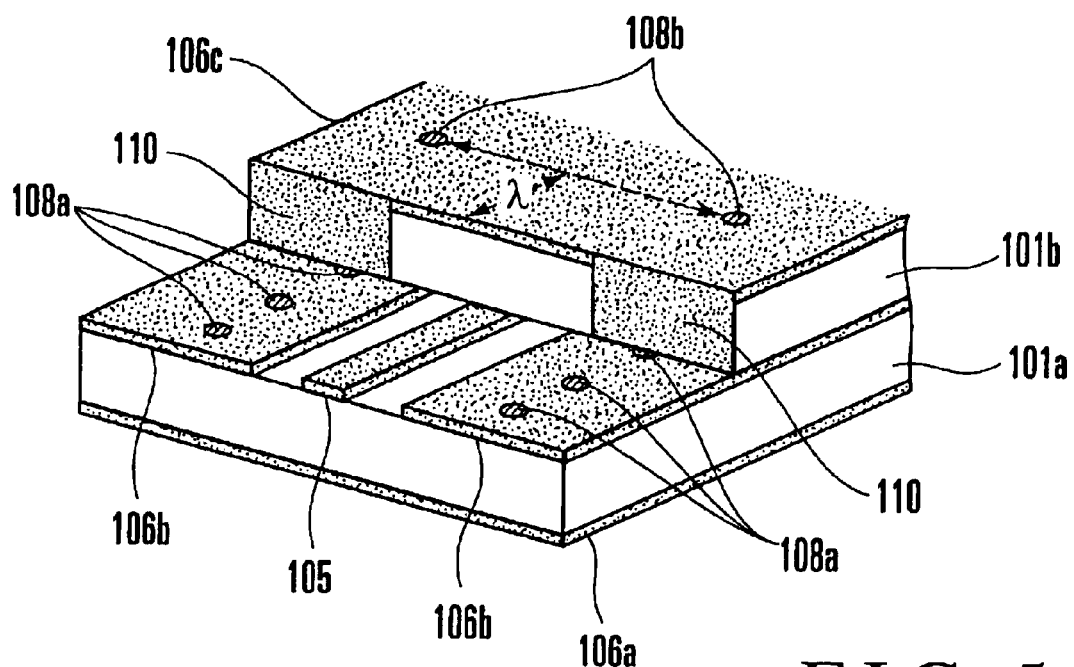
FIG. 5 is a perspective view of a feed-through according to the second embodiment of the present invention.

The difference between the first and second embodiments resides in that, in the second embodiment, as shown in FIG. 5, on a connection interface b–b' between a coplanar line 104a and inner layer line 104b (see FIG. 6), a pair of plate-like interface metal portions 110 are formed by plating or the like on the two sides of a signal conductor 105 so as to connect ground conductors 106b and 106c to each other. In this case, as shown in FIG. 6, the interface metal portions 110 project toward the coplanar line 104a by an amount corresponding to the thicknesses of the plates.

If the ground conductors 106b and 106c are not connected to each other with the interface metal portions 110, an effect is still provided by the interface metal portions 110. If the ground conductors 106b and 106c are connected to each other, a higher effect can be obtained. The same effect as that of the first embodiment can be obtained due to the presence of the interface metal portions 110. In this case, a distance λ (FIG. 7) from the connection interface b–b' to the center of the nearest-end via hole 108b formed in the inner layer line 104b must satisfy expression (3).

In the second embodiment as well, in order to cut off a higher-order mode, a pitch w (FIG. 6) of via holes 108b in a direction perpendicular to the signal propagating direction desirably satisfies expression (4).

According to the second embodiment, since the interface metal portions 110 are formed in place of the interface electrodes 109, no machining is needed other than forming the via holes 108b in a second layer substrate 101b. Thus, the manufacture is facilitated, and an improvement in yield is expected.

In the first and second embodiments described above, a ceramic material is used to form the package. As the material of the package, in place of the ceramic material, other inorganic or organic materials that can form a multilayered structure may be used.

As has been described above, according to the present invention, in a feed-through that connects the inside and outside of the cavity of an RF package, interface electrodes/metal portions are formed on the two sides of a signal conductor at the connection interface between the coplanar line and inner layer line. Therefore, signal radiation is suppressed to improve the transmission characteristics of the feed-through.

In particular, even if the distance between the connection interface between the coplanar line and inner layer line and the endmost via hole formed in the inner layer line is increased, since signal radiation is suppressed, the endmost via hole can be formed at a position well away from the connection interface. Thus, formation of the via hole is facilitated, and an improvement in yield of the manufacture can accordingly be expected, greatly contributing to mass production of high-performance millimeter-wave modules.

What is claimed is:

1. An RF package, comprising:

a multilayered dielectric substrate including first and second dielectric substrates, said multilayered dielectric substrate having a cavity in the second dielectric substrate where a semiconductor element is to be mounted on the first dielectric substrate within said cavity;

a feed-through for connecting an inside and outside of said cavity and comprised of a coplanar line disposed on said first dielectric substrate and an inner layer line disposed on the first dielectric substrate obtained by disposing said second dielectric substrate on said coplanar line, said coplanar line and said inner layer line sharing a signal conductor disposed on the first dielectric substrate;

metal members disposed at a connection interface between said coplanar line and said inner layer line on two sides of said signal conductor, and connecting first ground conductors of the coplanar line and the inner layer line on the first dielectric substrate to a second ground conductor disposed on a top surface of the second dielectric substrate at an edge of the second dielectric substrate; and a plurality of first via holes disposed in said first dielectric substrate and a plurality of second via holes disposed in said second dielectric substrate; and wherein edges of said metal members at said connection interface measuring a first length at said connection interface, said first length being larger than a diameter of at least one of: a portion of said plurality of first via holes in said first dielectric substrate, and a portion of said plurality of second via holes in said second dielectric substrate.

2. An RF package, comprising:

a multilayered dielectric substrate including first and second dielectric substrates, said multilayered dielectric substrate having a cavity in the second dielectric substrate where a semiconductor element is to be mounted on the first dielectric substrate within said cavity;

a feed-through for connecting an inside and outside of said cavity and comprised of a coplanar line disposed on said first dielectric substrate and an inner layer line disposed oil the first dielectric substrate obtained by disposing said second dielectric substrate on said coplanar line, said coplanar line and said inner layer line sharing a signal conductor disposed on the first dielectric substrate;

metal members disposed at a connection interface between said coplanar line and said inner layer line on two sides of said signal conductor, and connecting first ground conductors of the coplanar line and the inner layer line on the first dielectric substrate to a second ground conductor disposed on a top surface of the second dielectric substrate at an edge of the second dielectric substrate; and a plurality of first via holes disposed in said first dielectric substrate and a plurality of second via holes disposed in said second dielectric substrate; and wherein said metal members are metal plates projecting from a side of said second dielectric substrate extending beyond said connection interface in a direction toward said coplanar line.

3. An RF package, comprising:

a multilayered dielectric substrate including first and second dielectric substrates, said multilayered dielectric substrate having a cavity in the second dielectric substrate where a semiconductor element is to be mounted on the first dielectric substrate within said cavity;

a feed-through for connecting an inside and outside of said cavity and comprised of a coplanar line disposed on said first dielectric substrate and an inner layer line disposed on the first dielectric substrate obtained by disposing said second dielectric substrate on said coplanar line, said coplanar line and said inner layer line sharing a signal conductor disposed on the first dielectric substrate;

metal members disposed at a connection interface between said coplanar line and said inner layer line on two sides of said signal conductor, and connecting first ground conductors of the coplanar line and the inner layer line on the first dielectric substrate to a second ground conductor disposed on a top surface of the second dielectric substrate, said first and second ground conductors being connected at an edge of the second dielectric substrate; and a plurality of first via holes disposed in said first dielectric substrate and a plurality of second via holes disposed in said second dielectric substrate;

wherein said first ground conductors are disposed on an upper surface of said first dielectric substrate and arranged on two sides of said signal conductor to be away from each other at a predetermined distance; and said plurality of second via holes connect said first and second ground conductors to each other at positions away from said connection interface between said coplanar line and said inner layer line; and wherein a distance λ from said connection interface between said coplanar line and said inner layer line to a center of one of said second via holes which is at an end nearest to said connection interface is represented by $$\lambda < \frac{c}{2f\sqrt{\varepsilon_r}}$$

where c, f, and $\varepsilon_r$ respectively indicate a speed of light, a signal frequency, and a specific dielectric constant of said dielectric substrate.

4. An RF package, comprising:

a multilayered dielectric substrate including first and second dielectric substrates, said multilayered dielectric substrate having a cavity in the second dielectric substrate where a semiconductor element is to be mounted on the first dielectric substrate within said cavity;

a feed-through for connecting an inside and outside of said cavity and comprised of a coplanar line disposed on said first dielectric substrate and an inner layer line disposed on the first dielectric substrate obtained by disposing said second dielectric substrate on said coplanar line, said coplanar line and said inner layer line sharing a signal conductor disposed on the first dielectric substrate;

metal members disposed at a connection interface between said coplanar line and said inner layer line on two sides of said signal conductor, and connecting first ground conductors of the coplanar line and the inner layer line on the first dielectric substrate to a second ground conductor disposed on a top surface of the second dielectric substrate, said ground conductors being connected at an edge of the second dielectric substrate; and a plurality of first via holes disposed in said first dielectric substrate and a plurality of second via holes disposed in said second dielectric substrate;

wherein said first ground conductors are disposed on an upper surface of said first dielectric substrate and arranged on two sides of said signal conductor to be away from each other at a predetermined distance; and said plurality of second via holes connect said first and second ground conductors to each other at positions away from said connection interface between said coplanar line and said inner layer line; and wherein said plurality of second via holes are arranged on two sides of said signal conductor at a predetermined pitch w, and a pitch $\lambda_{p2}$ of said second via holes in a signal propagating direction is represented by $$\lambda_{p2} < \frac{c}{2f\sqrt{\varepsilon_r}}$$

where c, f, and $\varepsilon_r$ respectively indicate a speed of light, a signal frequency, and a specific dielectric constant of said dielectric substrate.

5. A package according to claim 4, wherein the predetermined pitch w between said plurality of second via holes in a direction perpendicular to the signal propagating direction is indicated by $$w < \frac{c}{2f\sqrt{\varepsilon_r}}.$$

6. A package according to claim 4, further comprising:

a third ground conductor disposed on a lower surface of said first dielectric substrate; and said plurality of first via holes are disposed in said first dielectric substrate to connect said first and third ground conductors to each other, said plurality of first via holes being arranged on two sides of said signal conductor at the predetermined pitch w.

7. A package according to claim 6, wherein a pitch $\lambda_{p1}$ of said plurality of propagating direction is represented by $$\lambda_{p1} < \frac{c}{2f\sqrt{\frac{\varepsilon_r+1}{2}}}.$$

* * * * *